US009257767B2

(12) United States Patent
Lewis

(10) Patent No.: US 9,257,767 B2
(45) Date of Patent: Feb. 9, 2016

(54) CONNECTOR ADAPTOR TO FACILITATE COUPLING OF A MATING CARD EDGE WITH A FEMALE CARD-EDGE CONNECTOR

(71) Applicant: Advanced Micro Devices, Inc., Sunnyvale, CA (US)

(72) Inventor: Donald C. Lewis, Richmond, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 70 days.

(21) Appl. No.: 14/158,808

(22) Filed: Jan. 18, 2014

(65) Prior Publication Data

US 2015/0207246 A1 Jul. 23, 2015

(51) Int. Cl.

| | |
|---|---|
| ***H05K 1/00*** | (2006.01) |
| ***H01R 12/72*** | (2011.01) |
| ***H01R 13/506*** | (2006.01) |
| *H01R 12/73* | (2011.01) |
| *H01R 12/71* | (2011.01) |
| *H01R 13/627* | (2006.01) |
| *H01R 13/6594* | (2011.01) |

(52) U.S. Cl.

CPC ............ *H01R 12/721* (2013.01); *H01R 13/506* (2013.01); *H01R 12/718* (2013.01); *H01R 12/732* (2013.01); *H01R 13/6273* (2013.01); *H01R 13/6594* (2013.01)

(58) Field of Classification Search

CPC ...................................................... H01R 13/648
USPC ............ 439/62, 374, 607.35, 607.4, 353, 357
See application file for complete search history.

(56) References Cited

U.S. PATENT DOCUMENTS

| | | | | |
|---|---|---|---|---|
| 7,303,438 | B2 * | 12/2007 | Dawiedczyk et al. | ... 439/607.53 |
| 2010/0210123 | A1 * | 8/2010 | Cole et al. | ....................... 439/79 |

OTHER PUBLICATIONS

Cox, Alvin "Information Technology-Serial Attached SCSI-3 (SAS-3)", Technical Committee of Accredited Standards Committee INCITS, Project T10/BSRINCITS 519, Revision 05e, Jul. 23, 2013, pp. 59-61.

* cited by examiner

*Primary Examiner* — Abdullah Riyami
*Assistant Examiner* — Nelson R Burgos-Guntin

(57) ABSTRACT

A connector adaptor facilitates coupling of a mating card edge with a corresponding female card-edge connector disposed on a circuit board. A gathering bevel at the face of the connector adaptor guides the mating card edge from the face of the connector adaptor to the slot at the connection surface of the female card-edge connector, thereby reducing the risk of damage to the female card-edge connector or the mating card edge during a blind mating attempt. In some embodiments the connector adaptor includes at least one connector tab such that the adaptor can be securely inserted into a cage preceding the slot opening of the female card-edge connector. In another embodiment the connector adaptor overlies the female card-edge connector to protect at least the connection surface of the female card-edge connector and can be fastened to the circuit board with any variety of fastening components.

19 Claims, 7 Drawing Sheets

CONNECTOR ADAPTOR TO FACILITATE COUPLING OF A MATING CARD EDGE WITH A FEMALE CARD-EDGE CONNECTOR

BACKGROUND

1. Field of the Disclosure

The present disclosure relates generally to the coupling of a printed circuit board (PCB) to a backplane, motherboard, or other circuit board and, more particularly, to coupling a mating card edge of a PCB to a corresponding female card-edge connector of a PCB.

2. Description of the Related Art

Modular computing systems often rely on the connection of one or more printed circuit boards (PCBs) to a corresponding backplane, motherboard, or other circuit board. To illustrate, server systems often employ a server chassis having a backplane with card-edge connectors into which one or more processor cards are inserted or connected, and desktop computers often employ expansion slots into which expansion cards may be inserted and connected. In many implementations, the technician building, maintaining, or modifying the computing system does not have a clear view of the card-edge connector on the backplane or motherboard during the board insertion process, and thus is required to attempt to insert a connector or mating card edge on the PCB into the corresponding card-edge connector without visual cues, with such instances of this process conventionally referred to as "blind mating" of the mobile/dynamic PCB and the corresponding fixed circuit board.

In many implementations, the PCB employs a mating card edge, that is, a paddle or other extension of the PCB substrate of the PCB, to form a mechanical and electrical connection with the corresponding card-edge connector on the circuit board. In a blind mating process, the technician may misalign the mating card edge relative to the corresponding card-edge connector and, as a result, damage one or both of the mating card edge or the card-edge connector while forcing the PCB toward the card-edge connector. To illustrate, server systems may employ a mini-Serial Attached Small Computer System Interface (mini-SAS) female card-edge connector to receive the mating card edge of a PCB encased within a housing terminating a flexible cable. These mini-SAS female card-edge connectors are standardized to employ a thin metal cage that precedes the slot opening of the card-edge connector, with the thin metal cage originally being intended as a retention mechanism for a corresponding male mini-SAS cable connector. However, with the adaptation of such mini-SAS female card-edge connectors for coupling with mating card edges of rigid PCBs alone, without a termination housing, this thin metal cage is prone to being severely bent or even shorn off during blind mating of a PCB with the mini-SAS female card-edge connector. Likewise, the primary housing of the mini-SAS female card-edge connector is susceptible to damage or detachment from the circuit board during the blind mating process.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

FIGS. 1-11 illustrate example techniques for using a connector adaptor to facilitate coupling of a mating card edge of a printed circuit board (PCB) or other circuit board with a corresponding female card-edge connector disposed on a backplane, motherboard, or other circuit board. A gathering bevel at the face of the connector adaptor guides the mating card edge from the face of the connector adaptor to a slot at a connection surface of the female card-edge connector. In some embodiments the female card-edge connector includes a thin metal cage or other structure preceding the connecting surface and slot, and the connector adaptor is configured so as to be inserted into the thin metal cage with at least one connector tab such that the connector adaptor can guide a mating card edge to the slot while bolstering the integrity of the metal cage. In other embodiments the connector adaptor comprises a housing that overlies the female card-edge connector and thus can be used in lieu of a cage to protect the female card-edge connector and to guide the mating card edge during blind mating of a PCB and the female card-edge connector, improving, strengthening, and securing the bond between the (often fragile) female card-edge connector and its circuit board. While FIGS. 1-11 illustrate a "parallel" mating regime, the same principles and methods could be applied to couple a mating card edge with an edge-card connector in an "orthogonal" mating regime, or other arrangement.

Figure 1:
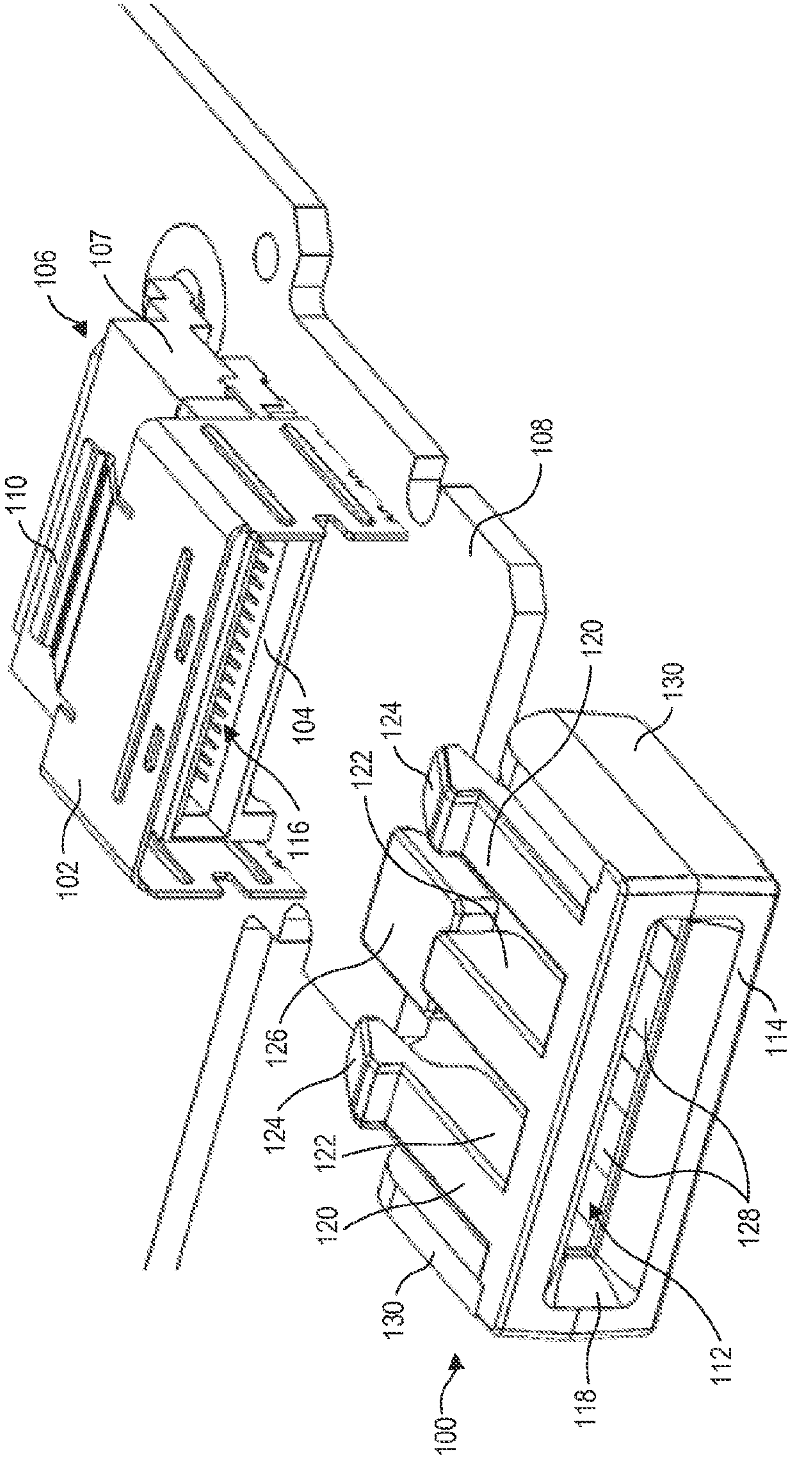
FIG. 1 is a perspective view of a connector adaptor configured to be inserted into a cage preceding the connection surface of a female card-edge connector so as to facilitate coupling between the female card-edge connector and a mating card edge of a printed circuit board (PCB) in accordance with some embodiments.

FIG. 1 illustrates a connector adaptor 100 for facilitating blind mating of a mating card edge of a PCB (not shown) with a corresponding female card-edge connector 106 in accordance with some embodiments. The connector adaptor 100 may be composed of any of a variety of suitable materials or combinations thereof, such as plastic, metal, wood, ceramic, etc. In the depicted example, the connector adaptor 100 is configured to be removably inserted into a cage 102 preceding a connection surface 104 of the female card-edge connector 106, which is disposed at a circuit board 108. The female card-edge connector 106 may be any type of connector disposed on a circuit board 108 with a cage 102 and which may be used to receive a mating card edge of a PCB. For ease of description, an example implementation of the female card-edge connector 106 as an internal mini-SAS receptacle connector is described herein, but the present disclosure is not limited to this type of female card-edge connector. The female card-edge connector 106 includes a slot 116 with an opening at the connection surface 104, whereby the slot 116 comprises a plurality of connection conductor contacts that are electrically coupled to corresponding traces or other conductive structures of the circuit board 108.

The cage 102 typically is composed of a thin metal sheet of a shape and dimensions originally intended for a corresponding male mini-SAS connector of a SAS or SCSI cable. In some implementations, the cage 102 is placed completely in front of the connection surface 104 of the female card-edge connector 106, while others have the cage 102 partially or completely covering a housing 107 of the female card-edge connector 106. The cage 102 may include a flap 110 that rests on or above the housing 107 of the female card-edge connector 106. The cage 102 may be attached to the circuit board 108 with insertion tabs, solder or adhesive. The circuit board 108 may be a motherboard, backplane, or any other circuit board 108.

The connector adaptor 100 includes a slot opening 112 at a face 114, such that the slot opening 112 has dimensions similar to the dimensions of the opening of the slot 116 and such that the slot opening 112 aligns with the slot 116 at the connection surface 104 of the female card-edge connector 106 when the connector adaptor 100 is inserted in the cage 102. The connector adaptor 100 further includes a gathering bevel 118 that circumscribes the slot opening 112 at the face 114 of the connector adaptor 100. The gathering bevel 118 includes bevel surfaces that angle in from an exterior surface of the face 114 to the slot opening 112. The gathering bevel 118 thus serves a gathering function whereby the gathering bevel 118 provides a larger initial contact area for initially capturing the mating card edge of a PCB and guiding, using the beveled edges, the mating card edge to the slot opening 112 (and thus ultimately guiding the mating card edge to the slot 116).

In one embodiment, the connector adaptor 100 includes a pair of connector tabs 120 extending from the top of the connector adaptor 100 ("top" being relative to the view of FIG. 1), whereby the connector tabs 120 are substantially perpendicular to the face 114 and extend rearward from the face 114. The term "substantially" is defined as largely but not necessarily wholly that which is specified. The term generally is defined as at least close to or approaching a given value or state (preferably within 10% of, more preferably within 1% of, and most preferably within 0.1% of) and includes what is specified (e.g., substantially perpendicular includes perpendicular and substantially parallel includes parallel), as understood by a person of ordinary skill in the art. The connector tabs 120 may comprise a neck 122 and a grab 124. The neck 122 is sloped or otherwise tapered to allow the connector tabs 120 to slide over the female card-edge connector 106, avoiding damage that could be caused by corners. As shown in greater detail below with reference to FIG. 2, the grab 124 allows the connector tabs 120 to hook onto the cage 102 so that the connector adaptor 100 can snap into place or otherwise be removably retained within the cage 102 when inserted into the cage 102. The tops of the grabs 124 may be sloped or otherwise tapered to allow for easier insertion and reduce contact that could result in snags or damaged parts during insertion of connector adaptor 100. The connector tabs 120 are dimensioned to fit between the top of the female card-edge connector 106 and the roof of the cage 102 and on either side of the flap 110 of the cage 102. Other embodiments may use different types and numbers of connector tabs in different locations to attach the connector adaptor 100 to the cage 102. Once inserted, the connector adaptor 100 can be removed from the cage 102 by depressing the connector tabs 120 relative to the roof of the cage 102, such as by applying pressure to the tops of the grabs 124, and sliding or otherwise moving the connector adaptor 100 away from the female card-edge connector 106 and out of the cage 102.

A shim 126 may extend from the top of the connector adaptor 100 substantially parallel to and between the connector tabs 120, such that the shim 126, when inserted under the roof of the cage 102 and above the female card-edge connector 106, lifts the flap 110, helping to secure the connector adaptor 100 in the cage 102. In some embodiments, the shim 126 may also include a neck 122 sloped to allow the shim 126 to slide over the female card-edge connector 106, avoiding damage that could be caused by corners and blunt surfaces.

A pair of base supports 128, extending from the bottom of the connector adaptor 100 substantially perpendicular to the face 114 and substantially parallel to the connector tabs 120 and the shim 126, guide the connector adaptor 100 during insertion into the cage 102, and help to stabilize and support the connector adaptor 100 within the cage 102. Base supports 128 additionally serve to guide the mating card edge toward desired alignment with the female card-edge connector. In some embodiments a pair of side braces 130 extend backward from the face 114 on each side of the connector adaptor 100 substantially parallel to the base supports 128, the connector tabs 120 and the shim 126. The connector adaptor 100 is configured such that the side braces 130 fit on the outside of the sides of the cage 102 to help maintain the connector adaptor 100 in place, as well as to protect the cage 102. Other embodiments of the removably-attachable connector adaptor 100 may omit the braces 130.

Figure 2:
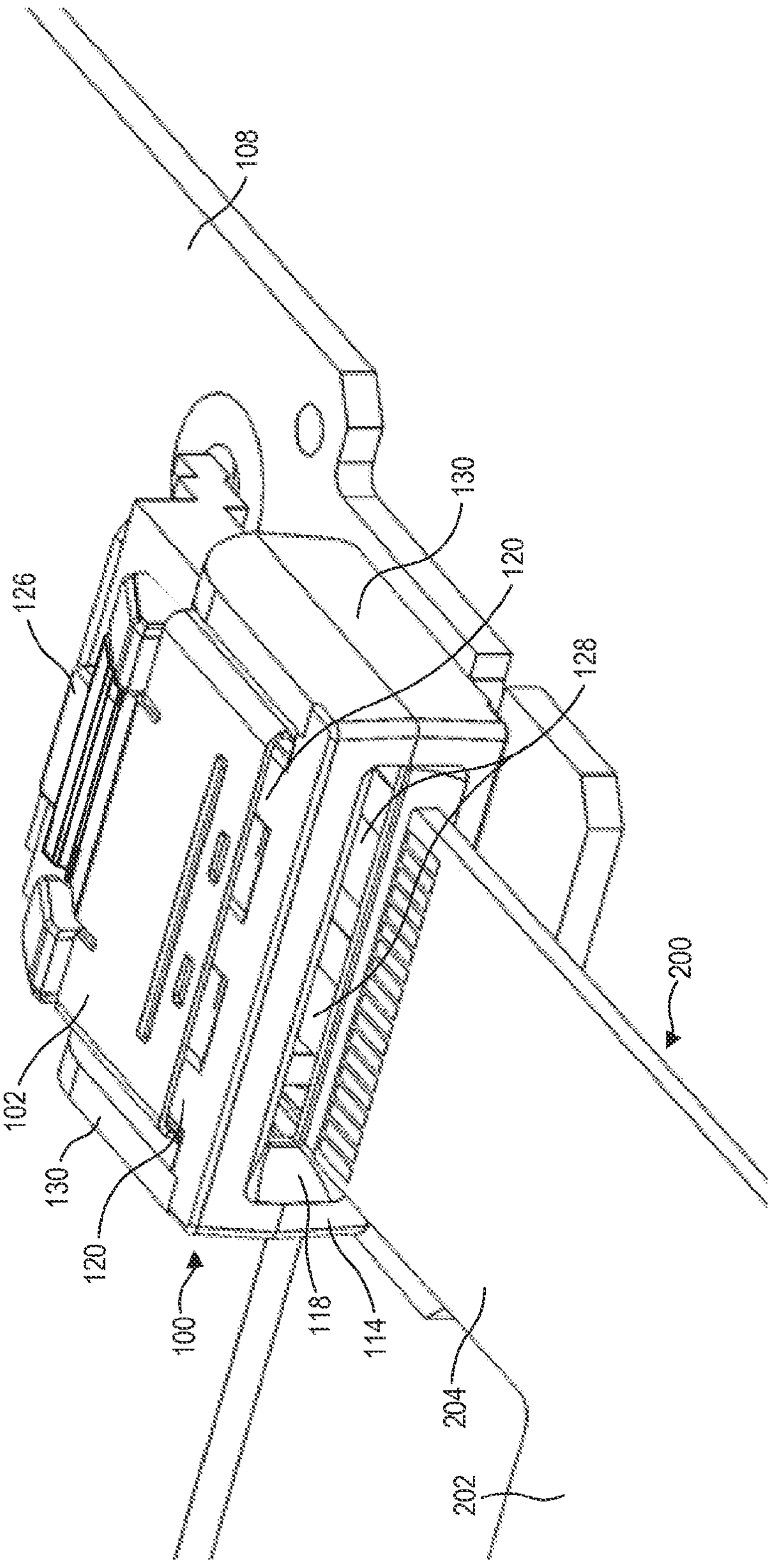
FIG. 2 is a front perspective view of the connector adaptor of FIG. 1 as inserted into the cage preceding the female card-edge connector of FIG. 1 in accordance with some embodiments.

FIG. 2 illustrates the connector adaptor 100 inserted into the cage 102 and receiving a mating card edge 200 of a board 202 in accordance with some embodiments. The board 202 may be any type of board, such as a PCB, a server blade, an expansion card, a sled, and the like. In one embodiment, the mating card edge 200 comprises a paddle 204 that extends beyond an edge of the board 202, and which includes conductive contacts (e.g., pads) compatible with the corresponding pins of the slot 116 (FIG. 1) of the female card-edge connector 106, as well as conductive traces or other conductive structures electrically connecting the conductive contacts to components of the board 202.

With the connector adaptor 100 in the inserted position, the connector tabs 120, the shim 126 and the base supports 128 are at least partially inside the cage 102, while the side braces 130 and the face 114 of the connector adaptor 100 remain outside of the cage 102. In one embodiment, the connector adaptor 100 does not include the side braces 130. Either way, the width of the face 114 extends beyond the width of the cage 102 to prevent the connector adaptor from being inserted too far into the cage 102, and to further provide stability to the connector adaptor 100 when inserted into the cage 102. The gathering bevel 118 at the face 114 receives the mating card edge 200 and provides a lead-in to guide the mating card edge 200 to the slot opening 112 of the connector adaptor 100, and thus guide the mating card edge to the slot 116 at the connection surface 104 of the female card-edge connector 106. This gathering feature reduces the likelihood of an improper alignment of the mating card edge 200 relative to the female card-edge connector 106 that would result in damage to one or more of the female card-edge connector 106, the cage 102, the board 202, the paddle 204, the mating card edge 200, or the circuit board 108.

Figure 3:
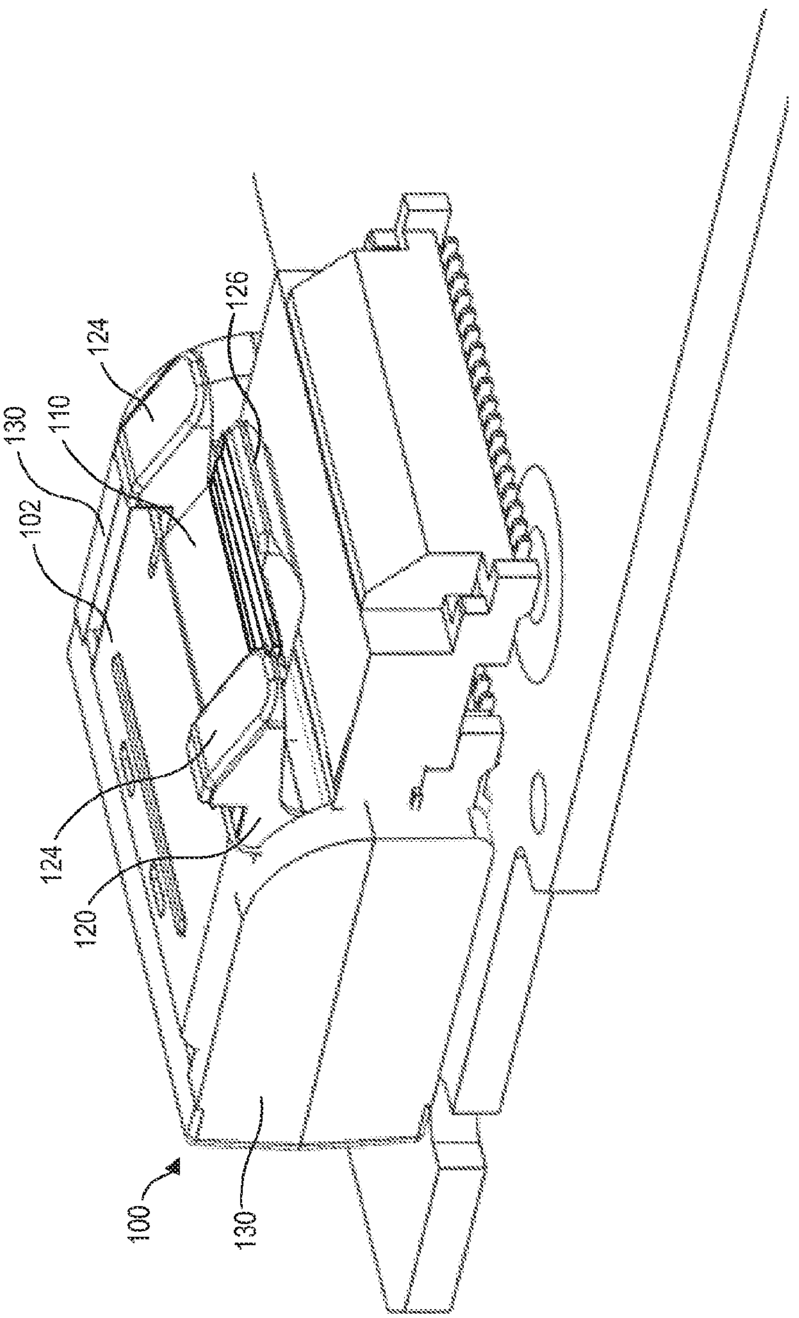
FIG. 3 is rear perspective view of the connector adaptor of FIG. 1 as inserted into the cage preceding the female card-edge connector in accordance with some embodiments.

FIG. 3 illustrates a rear view of the connector adaptor 100 inserted into the cage 102 in accordance with some embodiments. The grabs 124 of the connector tabs 120 can be seen extending beyond the roof of the cage 102, and the shim 126 lifting the flap 110, to snap the connector adaptor 100 into place once inserted into the cage 102. In some embodiments, the connector adaptor 100 is dimensioned to provide a friction coupling with the metal cage 102 when inserted. This friction coupling can be achieved with or without the connector tabs 120, the shim 126, and the braces 130. In other embodiments, the connector tabs 120 may comprise, for example, grapples, hooks, clamps, grips, brackets, clasps, or a combination thereof. As also shown by FIG. 3, the braces 130 extend along the side walls of the cage 102 to reinforce and protect the cage 102.

Figure 4:
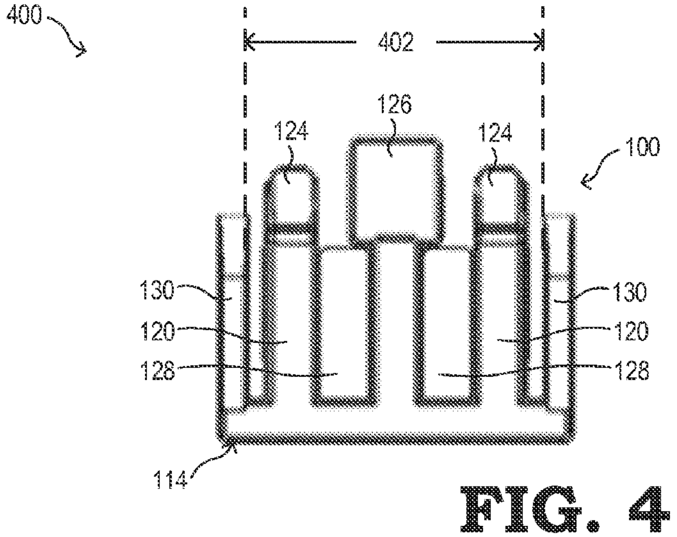
FIG. 4 is a top view of the connector adaptor of FIG. 1 in accordance with some embodiments.
Figure 5:
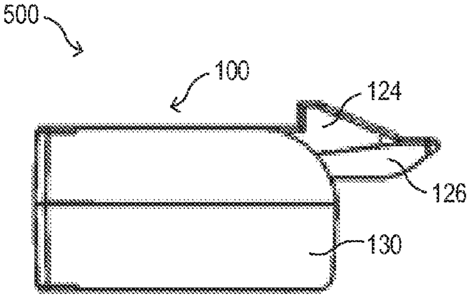
FIG. 5 is a side view of the connector adaptor of FIG. 1 in accordance with some embodiments.
Figure 6:
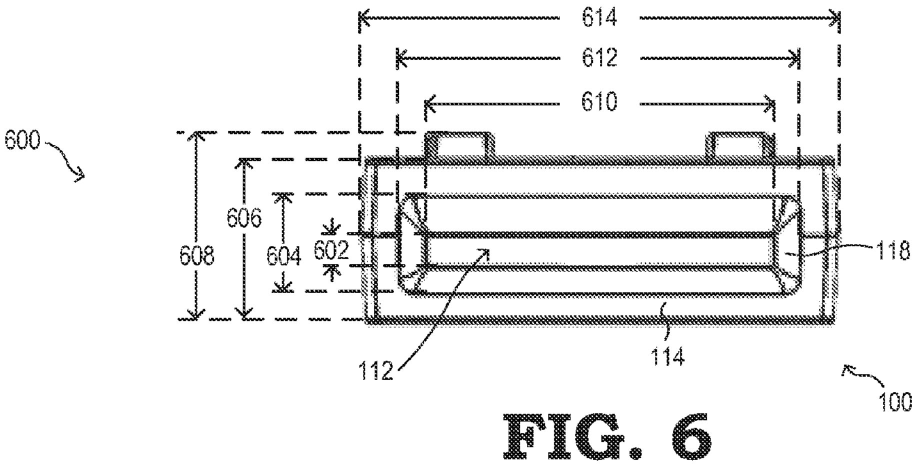
FIG. 6 is a front entry view of the connector adaptor of FIG. 1 in accordance with some embodiments.

FIGS. 4, 5 and 6 illustrate a top view 400, side view 500, and front view 600, respectively, of the connector adaptor 100 in accordance with some embodiments. Top view 400 illustrates the connector tabs 120, grabs 124, shim 126, face 114, base supports 128, and side braces 130 in greater detail. Width 402 represents the width between the side braces 130. Side view 500 illustrates side braces 130, grab 124, and shim 126 in greater detail. Front view 600 illustrates face 114, slot opening 112, gathering bevel 118, and grab 124 in greater detail. Height 602 represents the height of slot opening 112, while height 604 represents the height of the opening where the gathering bevel 118 begins, illustrating the height difference resulting from the lead-in. Height 606 represents the height of the connector adaptor 100, while height 608 represents the height of the grabs 124, illustrating that the grabs 124 have a height greater than that of the adaptor so that the grabs 124 can extend above the cage 102 (FIG. 3) to secure the connector adaptor 100 in the cage 102. In some embodiments the face 114 can have a height greater than the height of the connector tabs 120 or height 608 of the grabs 124. Width 610 represents a width of the slot opening 112, while width 612 represents the width of the opening where the gathering bevel 118 begins, illustrating the width difference resulting from the lead-in. Width 614 represents the width of the face 114, which is wider than the width of the cage 102.

Table 1 provides sample values for the dimensions provided in FIGS. 4 and 6.

| Dimensions | Sample Values |
|---|---|
| Width 402 | 19.2 mm |
| Height 602 | 1.5 mm |
| Height 604 | 4.7 mm |
| Height 606 | 8.0 mm |
| Height 608 | 9.2 mm |
| Width 610 | 16.9 mm |
| Width 612 | 19.4 mm |
| Width 612 | 20.3 mm |

Figure 7:
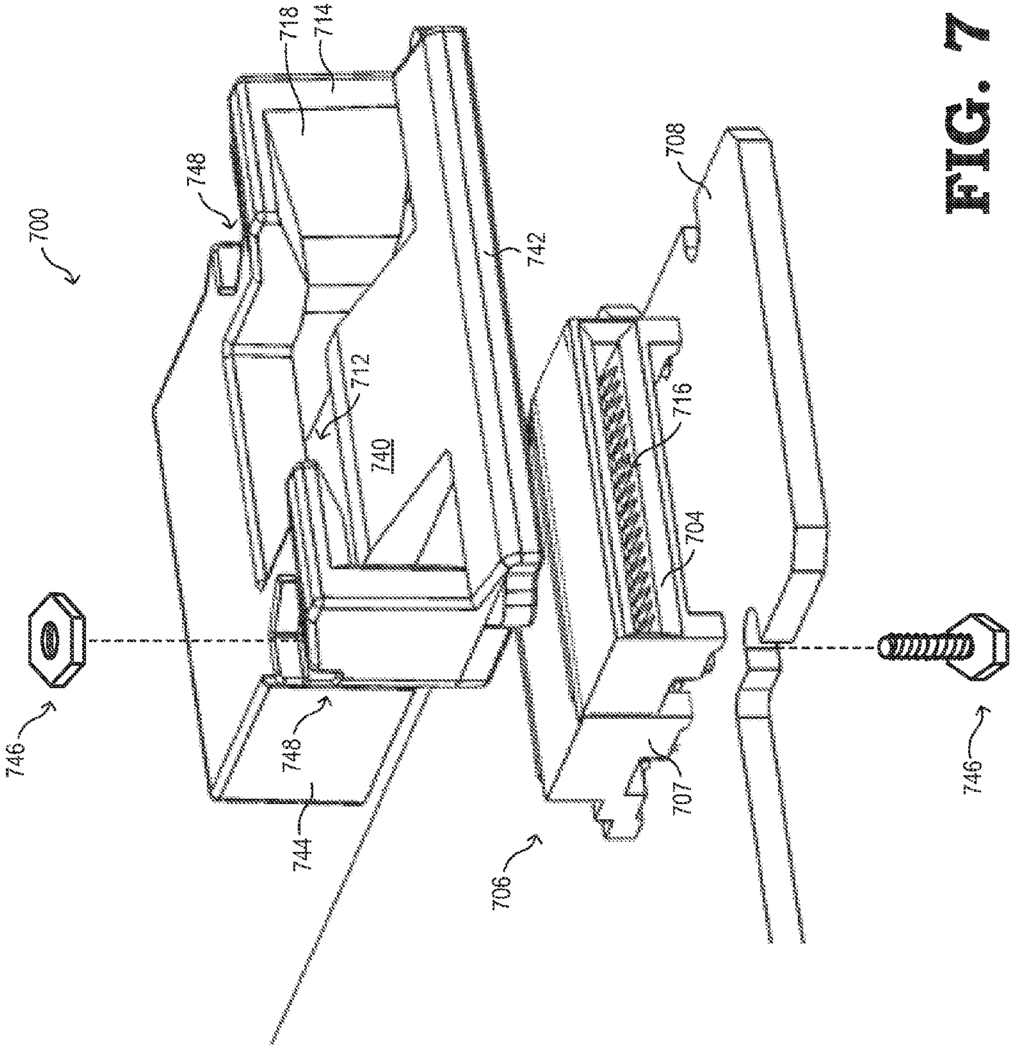
FIG. 7 is a perspective view of a connector adaptor configured to overlie a female card-edge connector so as to facilitate coupling between the female card-edge connector and a mating card edge of a PCB in accordance with some embodiments.

FIG. 7 illustrates a connector adaptor 700 configured to at least partially overlie or otherwise cover a female card-edge connector 706 disposed at a circuit board 708 in accordance with at least one embodiment of the present disclosure. In the depicted example, the connector adaptor 700 covers the entire female card-edge connector 706. However, in other embodiments the connector adaptor 700 covers only a portion of the front part of a housing 707 of the female card-edge connector 706 such that the connector adaptor 700 is disposed in front of the connection surface 704 of the female card-edge connector 706. The connector adaptor 700 may be used with or without a cage preceding the female card-edge connector 706. In the case that a cage precedes the connection surface 704 of the female card-edge connector 706, the connector adaptor 700 will at least partially cover and reinforce the cage, for example a thin metal cage. In the depicted example, the female card-edge connector 706 is implemented without a cage.

The connector adaptor 700 includes a slot opening 712 at a face 714 of the connector adaptor 700, such that the slot opening 712 aligns with a slot 716 at a connection surface 704 of the female card-edge connector 706 when the connector adaptor 700 is affixed over the female card-edge connector 706. The connector adaptor 700 further includes a gathering bevel 718 that circumscribes the slot opening 712 at the face 714 of the connector adaptor 700. The gathering bevel 718 includes bevel surfaces that angle in from an exterior surface of the face 714 to the slot opening 712. The gathering bevel 718 thus serves a gathering function whereby the gathering bevel 718 provides a larger initial contact area for initially capturing the mating card edge of a PCB and guiding, using the beveled edges, the mating card edge to the slot opening 712 (and thus ultimately guiding the mating card edge to the slot 716). In one embodiment, the gathering bevel 718 comprises a depressible ramp 740 extending from the face 714 of the connector adaptor 700 toward the slot 716 of the female card-edge connector 706. The depressible ramp 740 serves to guide a mating card edge up toward the slot opening 712 during the insertion process. One embodiment of the connector adaptor 700 further includes a lip 742 extending beyond the face 714 of the connector adaptor 700. In one embodiment, the width of the face 714 of the connector adaptor 700 is greater than the width of the female card-edge connector 706 (and the width of the cage if present), and the height of the face 714 is greater than the height of the female card-edge connector 706 (and the height of the cage if present), thereby providing a more substantial lead-in compared to the opening of the slot 716 of the female card-edge connector 706, and thus reducing the likelihood of damage during a blind mating.

The connector adaptor 700 includes a housing 744 to protect the female card-edge connector 706, as well as the cage if provided. In some embodiments the housing 744 is dimensioned to cover the entire housing 707 of female card-edge connector 706, while in other embodiments the housing 744 covers only a portion of the housing 707, for example, only the connection surface 704, while in still other embodiments the housing 744 does not cover the female card-edge connector 706 at all, but instead precedes the female card-edge connector 706 on the PCB 702.

The connector adaptor 700 may further include at least one fastening component 746 to affix the connector adaptor 700 to one or both of the circuit board 708 and the female card-edge connector 706. The fastening component 746 can include, for example, a screw, a bolt, adhesive, solder, or a combination thereof. In an implementation using screws or bolts, the connector adaptor 700 in one embodiment provides one or more holes 748 to receive the screws or bolts. These holes 748 can include, for example, threaded holes to receive machine screws or bolts as the fastening component 746. In some embodiments, the fastening component 746 is inserted from a bottom side of the circuit board 708, for example the fastening component 746 may comprise a self-tapping screw, or a machine screw and a machine nut. The one or more holes 748 may be located anywhere on the connector adaptor 700 that would fasten the connector adaptor 700 to the PCB 702 without interfering with the insertion and removal of a mating card edge, such as on the housing 744 in a location that would not interfere with the female card-edge connector 706.

Figure 8:
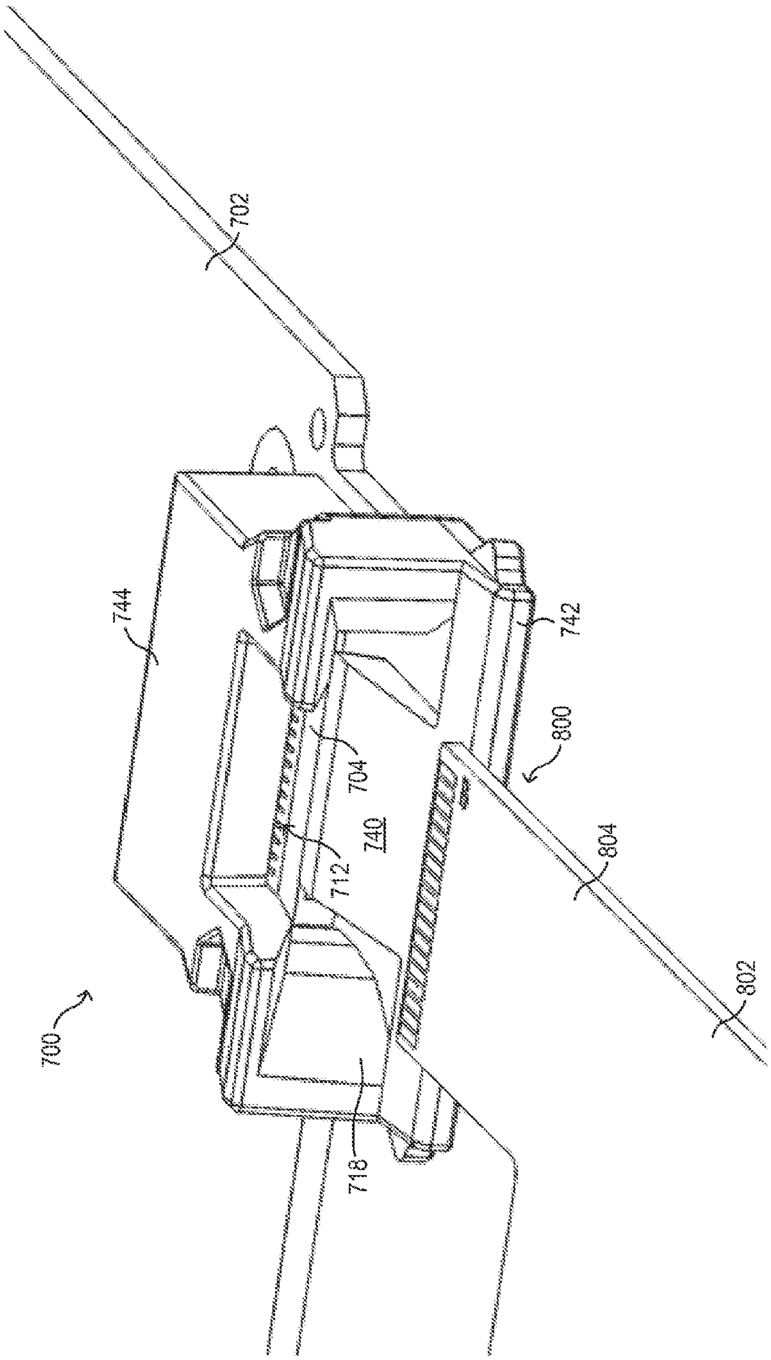
FIG. 8 is a perspective view of the connector adaptor of FIG. 7 while at least partially overlying the female card-edge connector in accordance with some embodiments.

FIG. 8 illustrates the connector adaptor 700 installed over at least a portion of the female card-edge connector 706 (FIG. 7) and receiving a mating card edge 800 of a board 802. The mating card edge 800 comprises a paddle 804 that extends beyond an edge of the board 802, and which includes conductive contacts (e.g., pads) compatible with the corresponding pins of the slot 716 of the female card-edge connector 706, as well as conductive traces or other conductive structures electrically connecting the conductive contacts to components of the board 802.

The lip 742, gathering bevel 718, and depressible ramp 740 receive the mating card edge 800 and provide a lead-in to guide the mating card edge 800 to the slot 716 at the connection surface 704 of the female card-edge connector 706, reducing the likelihood of an improper alignment that would result in damage to the female card-edge connector 706, the mating card edge 800, the cage (if provided), the board 802, the paddle 804, or the PCB 702. The depressible ramp 740 in some embodiments is flexible in view of the expected forces to be applied during the blind mating process such that it can be depressed by pressure from the mating card edge 800, further reducing the likelihood of damage to the mating card edge 800 or the ramp 740 as a result of a downward force on the ramp 740 while inserting the mating card edge 800.

Figure 9:
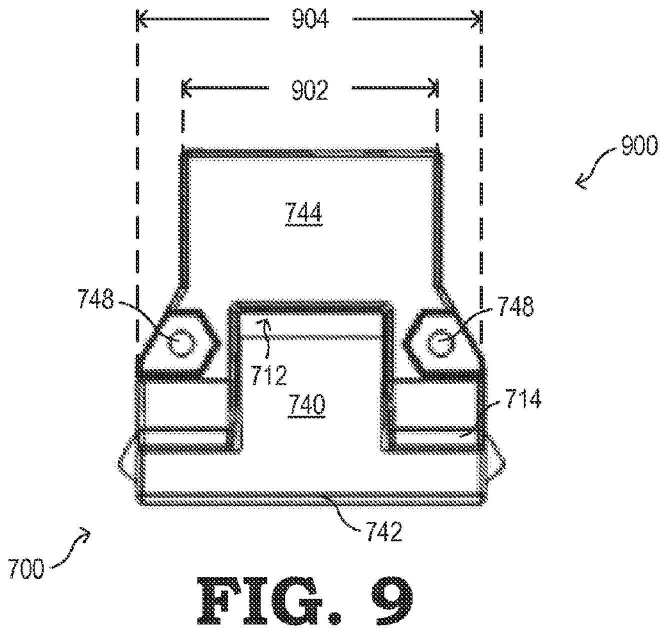
FIG. 9 is a top view of the connector adaptor of FIG. 7 in accordance with some embodiments.
Figure 10:
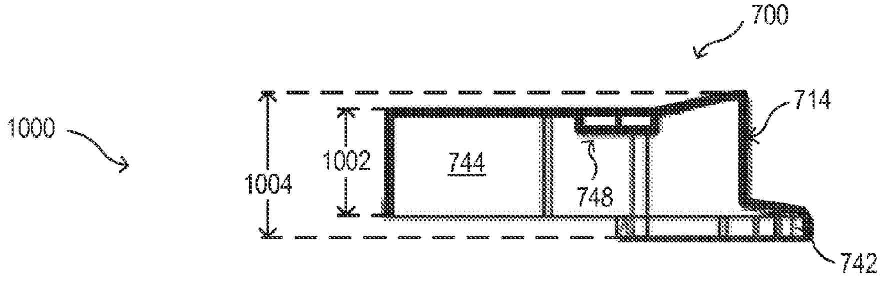
FIG. 10 is a side view of the connector adaptor of FIG. 7 in accordance with some embodiments.
Figure 11:
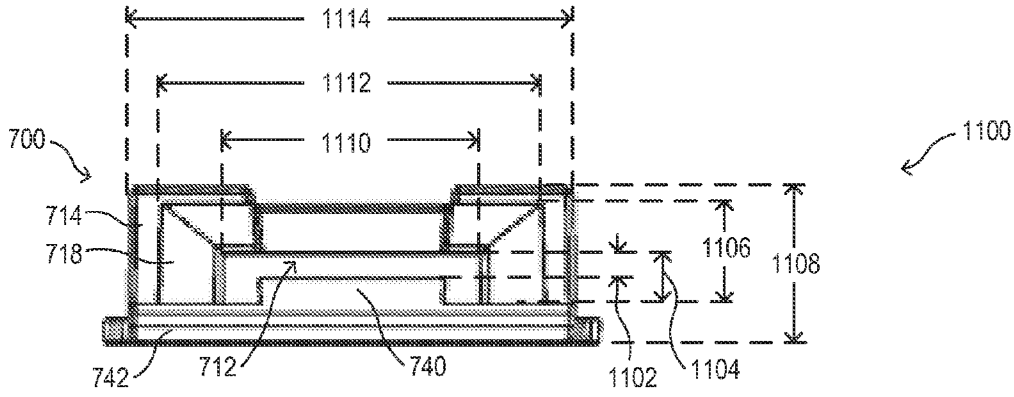
FIG. 11 is a front entry view of the connector adaptor of FIG. 7 in accordance with some embodiments.

FIGS. 9, 10 and 11 illustrate a top view 900, side view 1000, and front view 1100, respectively, of the connector adaptor 700. Top view 900 illustrates the housing 744, depressible ramp 740, lip 742, face 714, slot opening 712, and holes 748 in greater detail. Width 902 represents the width of the housing 744, while width 904 represents the width of the face 714. Side view 1000 illustrates the lip 742, holes 748, face 714, and housing 744 in greater detail. Height 1002 represents the height of the housing 744, while height 1004 represents the height of the face 714. Front view 1100 illustrates the gathering bevel 718, face 714, slot opening 712, lip 742, and ramp 740 in greater detail. Height 1102 represents the height of slot opening 712 created by the ramp 740 and gathering bevel 718, while height 1104 represents the opening created by the gathering bevel 718 without the ramp 740. Height 1106 represents the height of the opening at the face 714 before the gathering bevel 718, while height 1108 represents the height of the face 714, including lip 742. Heights 1102, 1104, 1106, and 1108 illustrate the lead-in created by the lip 742, gathering bevel 718, and ramp 740.

Table 2 provides sample values for the dimensions provided in FIGS. 9-11.

| Dimensions | Sample Values |
|---|---|
| Width 902 | 21.6 mm |
| Width 904 | 29.0 mm |
| Height 1002 | 7.5 mm |
| Height 1004 | 10.2 mm |
| Height 1102 | 1.7 mm |
| Height 1104 | 3.3 mm |
| Height 1106 | 6.6 mm |
| Height 1108 | 4.6 mm |
| Width 1110 | 17.0 mm |
| Width 1112 | 25.0 mm |
| Width 1114 | 29.0 mm |

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art will appreciate that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A removably attachable connector adaptor to facilitate coupling of a mating card edge of a first circuit board with a slot at a connection surface of a female card-edge connector disposed on a second circuit board, the connector adaptor comprising:

a slot opening at a face of the connector adaptor, the slot opening to align with the slot of the female card-edge connector;

a gathering bevel circumscribing the slot opening at the face of the connector adaptor, the gathering bevel to guide the mating card edge from the face of the connector adaptor through the connector adaptor to the slot at the connection surface of the female card-edge connector; and at least one connector tab extending substantially perpendicular to and in an opposite direction from the face of the connector adaptor, the at least one connector tab to removably affix the connector adaptor within a metal cage disposed on the second circuit board and in front of the connection surface of the female card-edge connector.

2. The removably attachable connector adaptor of claim 1, wherein the connector adaptor is dimensioned to provide a friction coupling with the metal cage when inserted into the metal cage.

3. The removably attachable connector adaptor of claim 1, further comprising:

at least one base support extending from the face of the connector adaptor substantially parallel to the at least one connector tab.

4. The removably attachable connector adaptor of claim 1, wherein the width of the face of the connector adaptor is greater than the width of the metal cage.

5. The removably attachable connector adaptor of claim 1, wherein the connector adaptor is composed of plastic.

6. The removably attachable connector adaptor of claim 1, wherein the at least one connector tab comprises at least one of: a grapple; a hook; a clamp; a grip; a bracket; and a clasp.

7. The removably attachable connector adaptor of claim 1, wherein the female card-edge connector is an internal mini-SAS (Serial Attached Small Computer System Interface) receptacle connector.

8. A connector adaptor to facilitate coupling of a mating card edge of a first circuit board with a slot at a connection surface of a female card-edge connector disposed on a second circuit board, the connector adaptor comprising:

a slot opening at a face of the connector adaptor, the slot opening to align with the slot of the female card-edge connector;

a gathering bevel circumscribing the slot opening at the face of the connector adaptor, the gathering bevel to guide the mating card edge from the face of the connector adaptor through the connector adaptor to the slot at the connection surface of the female card-edge connector; and a housing, the housing to overlie at least a portion of a housing of the female card-edge connector.

9. The connector adaptor of claim 8, further comprising:

a depressible ramp extending from the face of the connector adaptor toward the slot of the female card-edge connector.

10. The connector adaptor of claim 8, further comprising:

a lip extending beyond the face of the connector adaptor.

11. The connector adaptor of claim 8, further comprising:

at least one fastening component to facilitate fastening of the connector adaptor to the second circuit board.

12. The connector adaptor of claim 11, wherein the at least one fastening component comprises at least one of: a screw; a bolt; adhesive; and solder.

13. The connector adaptor of claim 8, further comprising:

at least one hole to receive a fastening component to fasten the connector adaptor to the second circuit board.

14. The connector adaptor of claim 8, wherein the female card-edge connector is an internal mini-SAS (Serial Attached Small Computer System Interface) receptacle connector.

15. An apparatus comprising:

a first circuit board;

a female card-edge connector disposed on the first circuit board, the female card-edge connector having a slot at a connection surface;

a metal cage disposed on the first circuit board and in front of the connection surface of the female card-edge connector; and a removably attachable connector adaptor disposed in the metal cage to facilitate coupling of a mating card edge of a second circuit board with the female card-edge connector disposed on the second circuit board, the connector adaptor comprising:

at least one connector tab extending substantially perpendicular to and in an opposite direction from a face of the connector adaptor, the at least one connector tab to removably affix the connector adaptor within the metal cage;

a slot opening at the face of the connector adaptor, the slot opening to align with the slot at the connection surface of the female card-edge connector; and a gathering bevel circumscribing the slot opening at the face of the connector adaptor, the gathering bevel to guide the mating card edge of the second circuit board through the connector adaptor from the face of the connector adaptor to the slot at the connection surface of the female card-edge connector.

16. The apparatus of claim 15, wherein the connector adaptor is dimensioned to provide a friction coupling with the metal cage when inserted into the metal cage.

17. The apparatus of claim 15, wherein the connector adaptor further comprises:

at least one base support extending from the face of the connector adaptor substantially parallel to the at least one connector tab.

18. The apparatus of claim 15, wherein the width of the face of the connector adaptor is greater than the width of the metal cage.

19. The apparatus of claim 15, wherein the female card-edge connector is an internal mini-SAS (Serial Attached Small Computer System Interface) receptacle connector.

* * * * *